US007782919B2

(12) United States Patent
Ae

(10) Patent No.: US 7,782,919 B2
(45) Date of Patent: Aug. 24, 2010

(54) BURIED SEMICONDUCTOR LASER AND METHOD FOR MANUFACTURING THE SAME

(75) Inventor: Satoshi Ae, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 112 days.

(21) Appl. No.: 12/000,062

(22) Filed: Dec. 7, 2007

(65) Prior Publication Data
US 2008/0137702 A1 Jun. 12, 2008

(30) Foreign Application Priority Data
Dec. 11, 2006 (JP) ............... 2006-333261

(51) Int. Cl.
H01S 5/00 (2006.01)
(52) U.S. Cl. ................................. 372/45.011
(58) Field of Classification Search ............. 372/45.011
See application file for complete search history.

(56) References Cited
U.S. PATENT DOCUMENTS
4,575,851 A * 3/1986 Seki et al. ................ 372/45.01

FOREIGN PATENT DOCUMENTS
JP    61164284 A  *  7/1986
JP    04-022185       1/1992
JP    11-087764       3/1999
JP    2004-095975     3/2004

OTHER PUBLICATIONS

Peng et al., "Extremely low resistance nonalloyed ohmic contacts on GaAs using InAs/InGaAs and InAs/GaAs strained-layer superlattices", Sep. 5, 1988, AIP, Appl. Phys. Lett., 53(10), 900-901.*
"Low Threshold Highly Efficient Strained Quantum Well Lasers At 1-5 Micrometre Wavelength" "Electronics Letters" Mar. 29, 1990 vol. 26 No. 7 pp. 465-467 Author: AT&T Bell Laboratories Holmdel, NJ. 07733, U.S.A.

* cited by examiner

Primary Examiner—Minsun Harvey
Assistant Examiner—Joshua King
(74) Attorney, Agent, or Firm—McGinn IP Law Group, PLLC

(57) ABSTRACT

A buried semiconductor laser exhibiting a reduced dislocation of a contact layer is achieved. A buried semiconductor laser, comprising: an n-type indium phosphide (InP) substrate; an active layer disposed on the n-type InP substrate; block layers provided so as to bilaterally disposed on both sides of the active layer; a clad layer provided so as to cover the active layer and the block layers; and a p-type gallium indium arsenide (InGaAs) contact layer provided on the clad layer, wherein the p-type InGaAs contact layer has a compressive strain.

16 Claims, 5 Drawing Sheets

BURIED SEMICONDUCTOR LASER AND METHOD FOR MANUFACTURING THE SAME

This application is based on Japanese patent application No. 2006-333,261, the content of which is incorporated hereinto by reference.

BACKGROUND

1. Technical Field

The present invention relates to a buried semiconductor laser and a method for manufacturing the same. Specifically, the present invention relates to a structure of a p-type gallium indium arsenide (InGaAs) contact layer in a buried semiconductor laser of group III-V element, employed for optical communications, and a method for manufacturing the same.

2. Related Art

In an optical transmission system that achieves a communication with higher capacity and higher rate, semiconductor lasers employed as light sources are mainly composed of indium phosphide (InP)-containing, group III-V compound semiconductors. Lower threshold current and higher efficiency are required for an active layer in a semiconductor laser, so that a strained quantum-well structure is used in order to improve such characteristics. For example, a technology for achieving a lower threshold current by applying compressive strain of 1.53% to a well layer is disclosed in Electronics Letters, vol. 26 (1990), p.p. 465-467. However, when a strain larger than a critical strain is applied to a quantum well layer, a defect such as dislocation is generated in an emission layer, considerably deteriorating laser characteristics. To solve the problem, Japanese Patent Laid-Open No. H4-22,185 (1996) discloses a semiconductor optical device having a quantum well layer composed of a multiple-layered structure with compressive strain layers and tensile strain layers, so that an average strain is reduced to a level of not higher than a threshold strain, thereby achieving an improved performance of a semiconductor optical device.

Since a larger strain to the active layer is applied to the semiconductor devices described above at a level up to the limit of the material property, the devices are structurally vulnerable by a stress generated in the whole laser device. In general, a buried structure, which is manufactured by forming pn-buried type or higher resistance buried-type current-blocking structures are formed on both sides of the active layer and then filling the whole current-blocking structures with an InP clad layer, is also employed in order to reduce a leakage current from the semiconductor laser around the active layer at wider range of temperatures to achieve a faster operation of the device. In such buried layer, it is required to control a strain for the purpose of avoiding a generation of a dislocation extending to the active layer.

In a semiconductor light emission device described in Japanese Patent Laid-Open No. H11-87,764 (1999), a multiple-layered semiconductor layer including a buffer layer, a first clad layer, an active layer, a second clad layer and a cap layer is formed on an n-InP compound semiconductor substrate. The semiconductor light emission device described in Japanese Patent Laid-Open No. H11-87,764 is configured that at least one of a buffer layer and a cap layer has a tensile strain, so that improvements in device characteristics such as reduction in threshold current would be achieved.

On the other hand, a semiconductor laser device having a contact layer is disclosed in Japanese Patent Laid-Open No. 2004-95,975. The semiconductor laser device disclosed in Japanese Patent Laid-Open No. 2004-95,975 is designed that a different strain level between in a first active layer and in a second active layer, so as to suitably control a gain peak wave-length. The semiconductor laser device described in Japanese Patent Laid-Open No. 2004-95,975 is provided with a strain adjustment film to control a strain in the active layer. A growth of an InGaAs contact layer described in Japanese Patent Laid-Open No. 2004-95,975 is conducted concurrently with a growth of the active layer, which achieves a flat geometry. Since a strain in the active layer is created by utilizing film stresses generated in an insulating film and an electrode film disposed on the InGaAs contact layer in Japanese Patent Laid-Open No. 2004-95,975, the InGaAs contact layer does not exhibit a strain.

In a structure of a buried semiconductor laser employing an n-type InP substrate, a p-type InGaAs contact layer having a carrier density of $1 \times 10^{19}$ cm$^{-3}$ or higher is required to be disposed between a p-side metallic electrode and a p-type InP clad layer, for reducing a driving current of semiconductor laser. Since such structure of the buried semiconductor laser employing the n-type InP substrate is configured that the pnp buried layers or the high resistance buried layers are selectively grown on both sides of the active layer, the whole structure is filled with the p-type InP clad layer, and then the p-type InGaAs contact layer is grown, the portion of the resultant contact layer immediately above the active layer is not completely flat and an inclined portion is remained.

When the InGaAs contact layer is in lattice match with InP at a flat section that is sufficiently remote by 50 μm or further from the inclined portion of the p-type InGaAs contact layer immediately above the active layer in such structure of the buried semiconductor laser employing the n-type InP substrate, a tensile strain toward the InP clad layer is applied at the inclined portion of the p-type InGaAs contact layer immediately above the active layer. Such tensile strain generated at the inclined portion of the p-type InGaAs contact layer immediately above the active layer may possibly induce a generation of a defect such as dislocation and the like, causing a concern for adversely affecting a reliability of the semiconductor device.

According to detailed investigations by the present inventors, it was found in such structure of the buried semiconductor laser employing the n-type InP substrate that, although the p-type InGaAs contact layer in the flat section, which is sufficiently remote by 50 μm or further from the inclined portion immediately above the active layer, is in a condition of lattice match on the InP substrate, a larger tensile strain of about 0.3 to 0.4% at a maximum is applied to the inclined portion immediately above the active layer. It is considered that the reason is a difference in uptake efficiency for atomic In and atomic Ga between the inclined portion and the flat portion. In general, the atomic uptake efficiency between the inclined portion and the flat portion is varied somewhat by growth conditions of the p-type InGaAs layer, but it is difficult to obtain the same composition for the inclined portion and for the flat portion. A tensile strain in the portion of the p-type InGaAs contact layer in the inclined portion immediately above the active layer may induce a generation of a defect such as dislocation and the like, leading to adversely affecting a reliability of the semiconductor device.

The present invention is made on the basis of the above-described circumstances, and is directed to a semiconductor device exhibiting an improved reliability by inhibiting a generation of a defect such as dislocation and the like.

SUMMARY

According to one aspect of the present invention, there is provided a buried semiconductor laser, comprising: an n-type indium phosphide (InP) substrate; an active layer disposed on the n-type InP substrate; block layers bilaterally provided on both sides of the active layer; a clad layer provided over the active layer and the block layers; and a p-type gallium indium arsenide (InGaAs) contact layer provided over the clad layer, wherein the p-type InGaAs contact layer has a compressive strain. A strain to be applied to the contact layer can be suitably controlled to reduce a tensile strain in the whole contact layer, so that a contact layer, which exhibits reduced chances of a generation of a dislocation, can be obtained.

According to another aspect of the present invention, there is provided a method for manufacturing a buried semiconductor laser, comprising: forming an active layer an on n-type InP substrate; forming block layers on both sides of the active layer; forming a clad layer over the active layer and the block layer; and forming a p-type InGaAs contact layer over the clad layer, wherein the forming the p-type InGaAs contact layer includes forming the p-type InGaAs contact layer having a compressive strain.

The buried semiconductor laser according to the present invention may alternatively have a configuration, in which the p-type InGaAs contact layer includes a flat portion remote from a portion thereof immediately above the active layer and an inclined portion immediately above the active layer, and furthermore the flat portion of the p-type InGaAs contact layer has a compressive strain that is not higher than a critical strain, and the inclined portion of the p-type InGaAs contact layer has a tensile strain that is not higher than a critical strain.

A composition of the flat portion is corrected toward a side of the compressive strain in the growth of the layer, so that the tensile strain in the inclined portion is reduced, thereby avoiding a generation of a defect such as dislocation and the like.

The buried semiconductor laser according to the present invention may alternatively have another configuration, in which the flat portion of the p-type InGaAs contact layer has a layer thickness of 0.3 μm, and the compressive strain of the flat portion is within a range of from 0.1% to 0.2%.

A p-type InGaAs contact layer having a thickness of 0.3 μm, which is a sufficient thickness for ensuring a diffusion length after an alloy process with an electrode metal, which is a necessary process for providing better ohmic contact with the electrode metal, was employed to conduct an investigation for a critical strain level on the basis of a model proposed by J. W. Matthews and A. E. Blakeslee (J. Crystal Growth, 27 (1974), J. W. Matthews and A. E. Blakeslee, 118-125), and the results of the investigation show that the compressive strain in the flat portion within a range of from 0.1% to 0.2% would provides a formation of the p-type InGaAs contact layer having the flat portion and the inclined portion, each of which has a thickness that is not higher than a critical strain, thereby reducing a generation of a defect such as dislocation and the like. The thickness of the p-type InGaAs contact layer of equal to or smaller than 0.3 μm provides further larger tolerance for the compressive strain composition of the p-type InGaAs contact layer.

The buried semiconductor laser according to the present invention may alternatively have further configuration, in which the p-type InGaAs contact layer is composed of a superlattice structure of a p-type indium arsenide (InAs) layer with a p-type gallium arsenide (GaAs) layer, and wherein the p-type InAs layer and the p-type GaAs layer have average compressive strains within a range of from 0.1% to 0.2% in the flat portion.

While the p-type InAs layer and the p-type GaAs layer have lattice misfits for the n-type InP substrate of +3.2% and −3.7%, respectively, an average compressive strain in the flat portion of the superlattice structure is controlled to be within a range of from 0.1% to 0.2%, such that the contact layer of p-type InAs/GaAs superlattice structure having the flat portion and the inclined portion, each of which has a thickness that is not higher than a critical strain, is obtained.

According to the present invention, the buried semiconductor laser exhibiting a reduced dislocation of the contact layer is achieved.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable exemplary implementations of buried semiconductor lasers according to the present invention will be described in reference to the annexed figures. In all figures, an identical numeral is assigned to an element commonly appeared in the description of the present invention in reference to the figures, and the detailed description thereof will not be repeated.

A buried semiconductor of an embodiment of the present invention includes an n-type InP substrate, an active layer disposed on the n-type InP substrate, block layers bilaterally provided on both sides of the active layer, a clad layer provided over the active layer and the block layers; and a p-type gallium indium arsenide (InGaAs) contact layer on the clad layer. When the p-type InGaAs crystal is intended to be grown on the n-type InP substrate, a strain ($\epsilon$) in the p-type InGaAs contact layer is determined by gallium (Ga) composition (x). Such relationship will be described as follows.

Lattice constants of InP, GaAs, InAs and InGaAs are written as $a(\text{InP})$, $a(\text{GaAs})$, $a(\text{InAs})$ and $a(\text{In}_{1-x}\text{Ga}_x\text{As})$, respectively, and $a(\text{InP}) = 5.8688$ angstroms;

$a(\text{GaAs}) = 5.6533$ angstroms;

$a(InAs)=6.0584$ angstroms; and $$\epsilon(In_{1-x}Ga_xAs)=xa(GaAs)+(1-x)a(InAs)=6.0584-0.4051x \quad (1),$$

according to "HIKARI TSUSHIN SOSHI KOGAKU" (Optical Communication Device Engineering), Kogaku Tosho Co., Ltd.), pp. 75. Therefore, relationship of strain ($\epsilon$) with Ga composition (x) is presented by the following formula 2:

$$\epsilon(\%)=[a(In1-xGaxAs)-a(InP)]/a(InP)=3.2306-6.9026x \quad (2).$$

Figure 5:
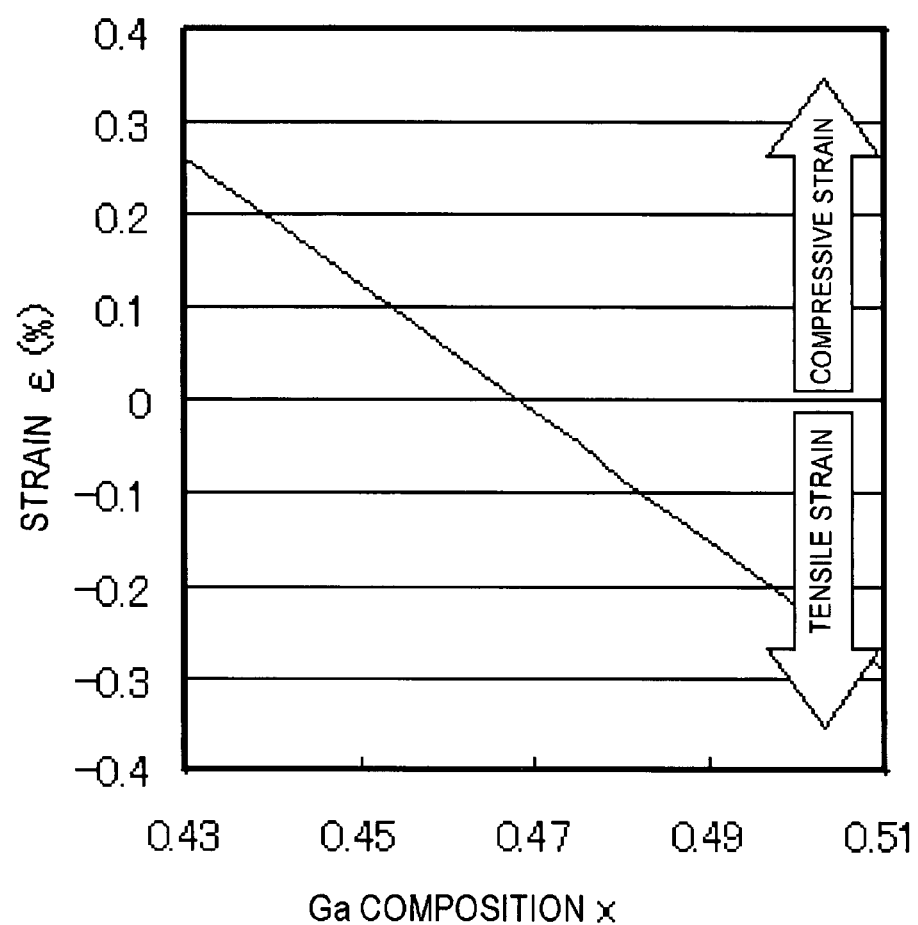
FIG. 5 is a graph showing a relationship of a composition of the p-type InGaAs layer with a strain.

A graph related to the above-described formula 2 is shown in FIG. 5, with ordinate for strain $\epsilon$ (%), abscissa for Ga composition x. A positive strain $\epsilon$ represents a compressive strain, and a negative strain $\epsilon$ represents a tensile strain. For example, when the p-type InGaAs contact layer has no strain ($\epsilon=0$), or more specifically, is in lattice match with the n-type InP substrate, the composition of the InGaAs contact layer is obtained as $In_{0.53}Ga_{0.47}As$ (x=0.47) according to formula 2. In the present invention, the composition of the InGaAs contact layer is determined by employing the above-described formula 2.

First Embodiment

Figure 1A:
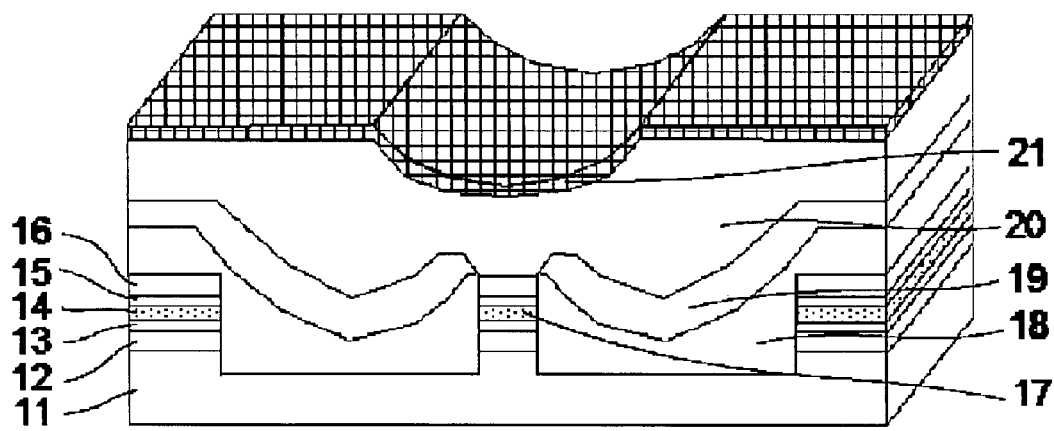
FIGS. 1A and 1B are a cross-sectional view of a buried semiconductor laser according to the first embodiment of the present invention.

FIG. 1A illustrates a structure of a buried semiconductor laser according to the first embodiment of the present invention. The semiconductor device of the present embodiment includes an n-type InP substrate 11, an active layer 17 as a light emitting region, a p-type current block layer 18, an n-type current block layer 19, a p-type clad layer 20, and a p-type InGaAs contact layer 21.

The block layers 18 and 19 are provided on both sides of the active layer 17. In other words, the active layer 17 is disposed between a pair of the block layers 18 and 19. The p-type clad layer 20 is disposed so as to cover the active layer 17 and the block layers 18 and 19.

Figure 1B:
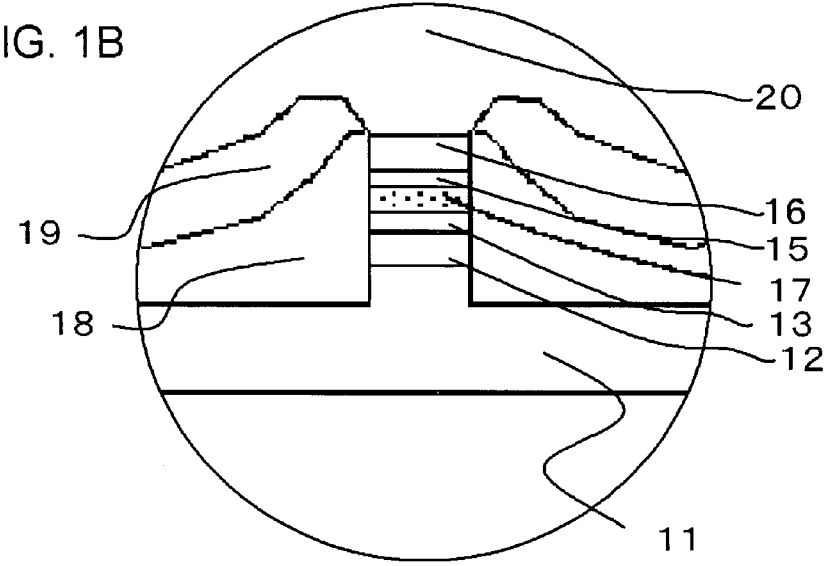

FIG. 1B illustrates an enlarged view of a structure around the active layer 17 showed in FIG. 1A. A mesa structure including an n-type InP clad layer 12, n-side InGaAsP guide layer 13, the active layer 17, a p-side InGaAsP guide layer 15, and a p-type InP clad layer 16 is provided on the n-type InP substrate 11. The active layer 17 has a quantum well structure.

The p-type InGaAs contact layer 21 is provided to cover the p-type InP clad layer 20. The contact layer 21 has an inclined portion in a region immediately above the active layers, and a flat portion in a region remote from the region immediately above the active layer. While the inclined portion is illustrated in FIG. 1 to have a configuration where a bottom surface has a U-shaped cross section, the configuration there of is not limited to such configuration, and for example, a configuration having a flat horseshoe cross section of the bottom surface may be employed.

Figure 2:
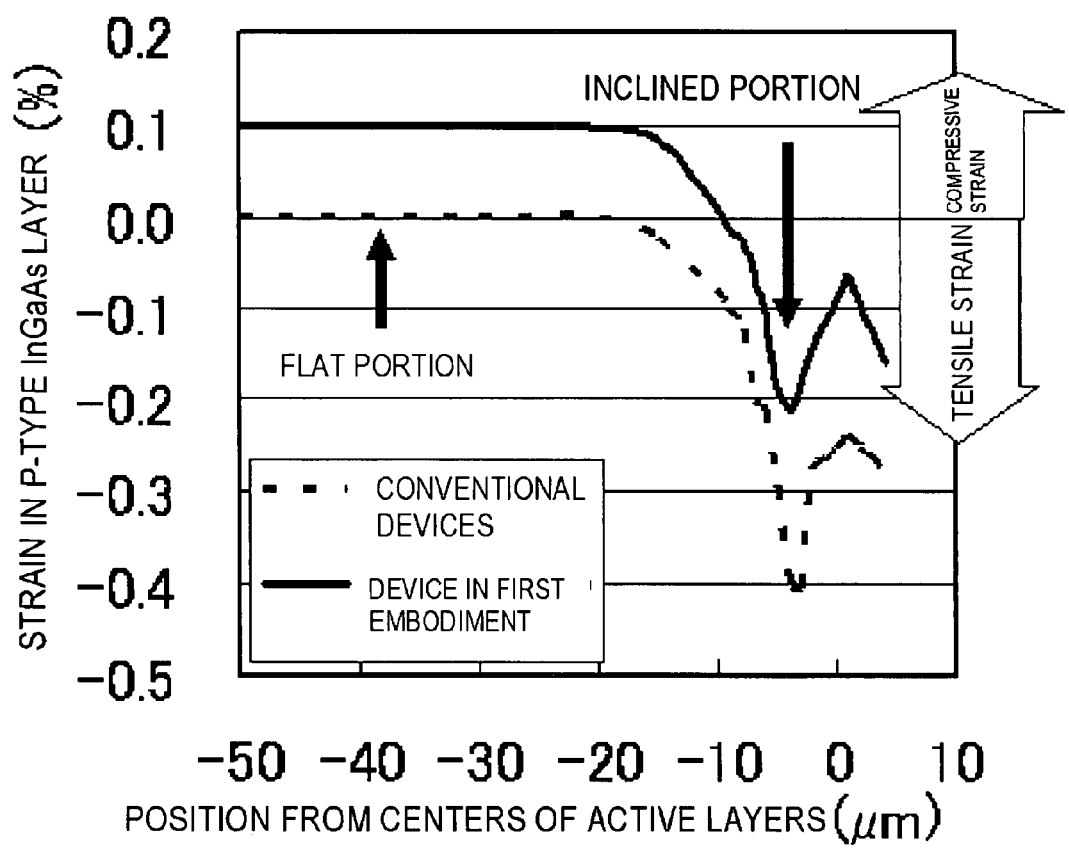
FIG. 2 is a graph showing a distribution of a strain in a p-type InGaAs layer of FIG. 1.

A strain in the portion of the p-type InGaAs contact layer 21 immediately above the active layers (inclined portion) over the p-type InP clad layer is evaluated in detail by utilizing μ-X-ray emitted from a light source of a synchrotron radiation. Such μ-X-ray evaluation is conducted by utilizing a light beam having a beam diameter of about 1 μm. FIG. 2 is graph showing a strain in the p-type InGaAs contact layer 21 over the p-type InP clad layer. Abscissa is a distance (μm) from the portion immediately above the center of the active layers, and ordinate is a strain (%) in the p-type InGaAs layer. A dotted line in FIG. 2 indicates a case, in which p-type InGaAs layer is in lattice match with InP in the flat portion, and in such case, a larger tensile strain is found in an inclined portion immediately above the active layers. On the other hand, a solid line indicates a strain in the contact layer in a case, in which supplies of In and Ga are corrected to provide a compressive strain of 0.1% in the flat portion of the p-type InGaAs layer. The composition of the contact layer for providing a compressive strain of 0.1% is $In_{0.546}Ga_{0.454}As$. Here, it is confirmed that the inclined portion immediately above the active layer and the flat portion have strains, which are equal to or lower than a critical strain according to the model of J. W. Matthews and A. E. Blakeslee.

Next, a process for manufacturing the buried semiconductor in first embodiment will be described in reference to FIGS. 4A to 4F. In the present embodiment, a crystal growth is conducted by a metalorganic vapor phase epitaxy (MOVPE) process, and source materials employed for the process includes trimethylindium (TMIn), triethylgallium (TEGa), arsine ($AsH_3$), phosphine ($PH_3$), disilane ($Si_2H_6$) and diethyl zinc (DEZn).

Figure 4:
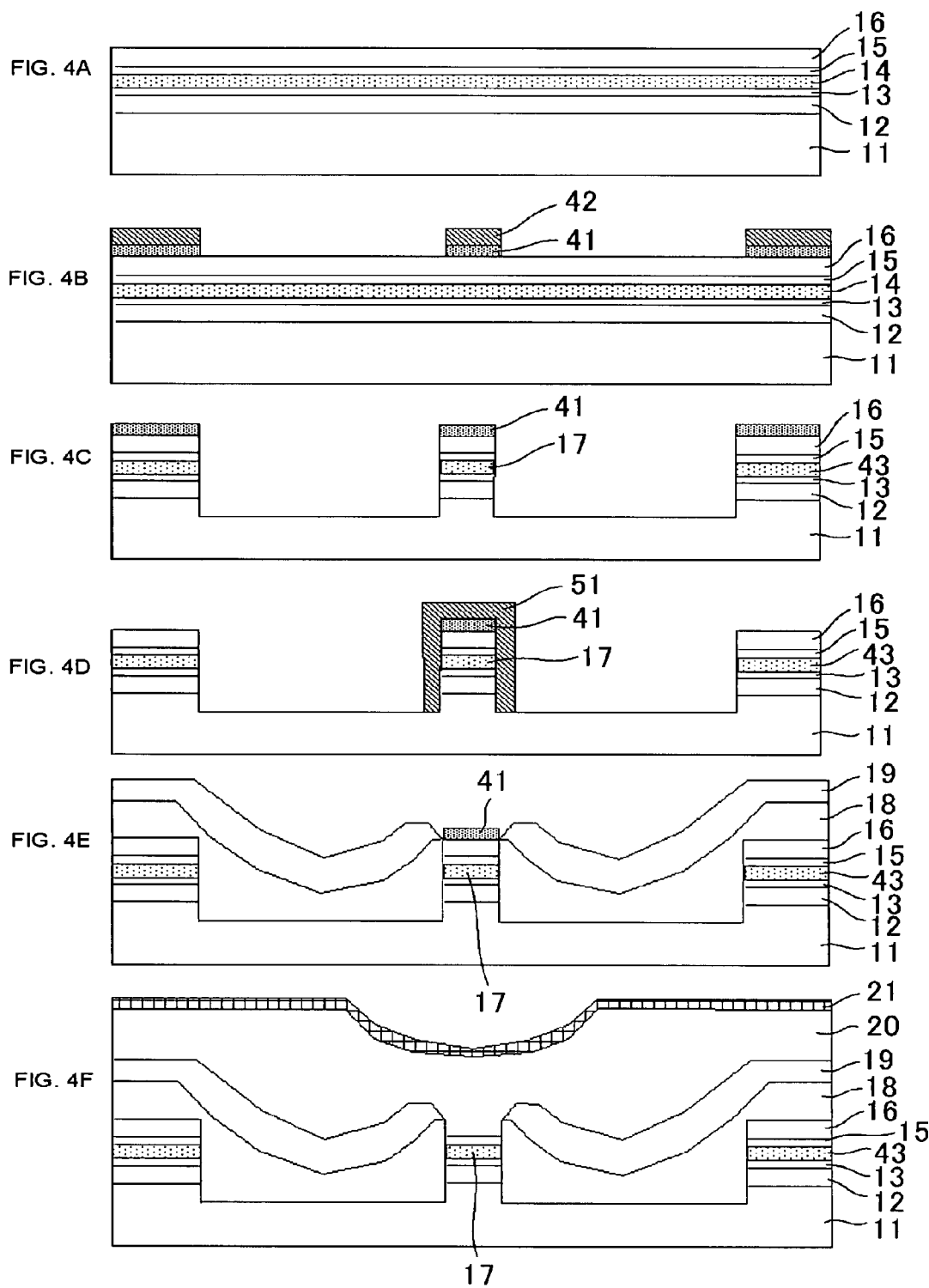
FIG. 4A to FIG. 4F are cross-sectional views of a buried semiconductor laser, showing a method for manufacturing the buried semiconductor laser according to the first embodiment of the present invention.

First of all, as illustrated in FIG. 4A, an n-type InP clad layer 12 (n=$1\times10^{18}$ cm$^{-3}$, thickness: 0.5 μm) an n-side InGaAsP guide layer 13 (thickness: 0.05 μm), a quantum well active layer 14 exhibiting a PL emission wavelength of 1.3 μm, a p-side InGaAsP guide layer 15 (thickness 0.05 μm) and a p-type InP clad layer 16 (p=$1\times10^{18}$ cm$^{-3}$, thickness: 1 μm) are consecutively grown in this sequence on an n-type InP (100) substrate 11 (n=$2\times10^{18}$ cm$^{-3}$). These layers 12 to 16 may alternatively made of other materials such as InGaAlAs, as long as the material is in lattice match with InP.

Subsequently, as shown in FIG. 4B, a silicon oxynitride (SiONx) film mask 41 is deposited on the p-type InP clad layer 16, and then a photo resist 42 is applied thereon, and a mesa etch pattern is formed in the SiONx film mask 41 by employing a known PR (photo resist) process.

Next, as shown in FIG. 4C, a mesa-etching is carried out to reach the n-type InP substrate 11 through a mask of the SiON-x film 41 by a dry etching or a wet etching. The quantum well active layer 14 showed in FIG. 4B is divided into an active layer 17 and a carrier recombined layer 43. In such case, the carrier recombined layer 43 may alternatively have an etched off structure. Alternatively, a patterned SiONx mask is formed on the n-type InP substrate 11, and then the active layers may be formed by a selective epitaxial growth technology.

Subsequently, as shown in FIG. 4D, the PR process is employed again to remove the SiONx film mask 41 on the carrier recombined layer 43 while only a portion of the SiONx film mask 41 on the active layer 17 is protected with a photo resist 51.

Next, as shown in FIG. 4E, block layers composed of a p-type InP block layer 18 ($1\times10^{18}$ cm$^{-3}$, thickness: 1.0 μm) and an n-type InP block layer 19 (n=$5\times10^{18}$ cm$^{-3}$, thickness: 0.5 μm) are grown through a selective mask of the portion of the SiONx film 41 on the active layer 17.

Furthermore, as shown in FIG. 4F, the portion of the SiONx mask 41 on the active layer 17 is removed, and then the whole substrate is covered with a p-type InP clad layer 20 (p=$1\times10^{18}$ cm$^{-3}$, thickness: 2.5 μm), and thereafter, a p-type InGaAs contact layer 21 (p=$1\times10^{19}$ cm$^{-3}$, thickness: 0.3 μm) is grown. In such case, the p-type InGaAs contact layer 21 is grown so as to have a compressive strain of 0.1 to 0.2% in the flat portion thereof that is sufficiently remote by 50 μm or further from the portion thereof immediately above the active layer 17. Here, the crystal growth of the contact layer is conducted by employing trimethylgallium (TEGa) as a source material of Ga, and trimethylindium (TMIn) as a source material of In, and the flow rates of these materials may be suitably controlled to provide a controlled strain to be applied to the contact layer. In order to form the contact layer having a compressive strain of 0.1 to 0.2%, the flow rates of trimethylgallium and trimethylindium can be adjusted according to the above-described formula 2 so as to obtain a composition of InGaAs within a range of from $In_{0.546}Ga_{0.454}As$ to $In_{0.561}Ga_{0.439}As$.

After the growth, a p-side electrode and an n-side electrode are formed by employing a known process for manufacturing semiconductor laser devices to obtain a semiconductor device. While the regions of the clad layer 20 and the contact layer 21 immediately above the active layer 17 are configured to have a U-shaped cross section of the bottom surface in FIG. 4F, the configuration is not limited thereto, and for example, an alternative configuration having a flat horseshoe cross section of the bottom surface may also be adopted.

Second Embodiment

Figure 3:
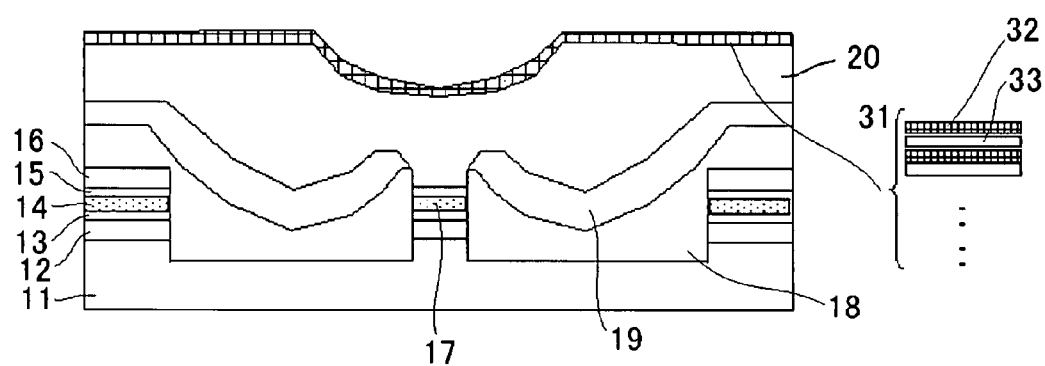
FIG. 3 is a cross-sectional view of a buried semiconductor laser according to the second embodiment of the present invention.

In reference to FIG. 3, another embodiment of a buried semiconductor laser, in which the p-type InGaAs contact layer 21 in FIG. 1 is replaced with a superlattice structure of a p-type InAs layer and a p-type GaAs layer will be described. In FIG. 3, the p-type InGaAs contact layer 31 is composed of a superlattice structure of a p-type InAs layer 32 and a p-type GaAs layer 33. In the present embodiment, similarly as in first embodiment, a growth is conducted to reach the p-type InP clad layer 20, and then an InAs/GaAs superlattice structure 31 composed of the p-type InAs layer 32 and the p-type GaAs layer 33 is grown. In such case, it is confirmed that the p-type InAs/GaAs superlattice structure 31 is grown to have an average compressive strain within a range of from 0.1% to 0.2% in the flat portion thereof that is sufficiently remote by 50 μm or further from the portion thereof immediately above the active layers, so that the flat portion and the inclined portion immediately above the active layer 17 have strains not higher than a critical strain.

While the region of the contact layer 31 immediately above the active layer 17 is configured to have the U-shaped cross section of the bottom surface in the present embodiment, the configuration is not limited thereto, and for example, an alternative configuration having a flat horseshoe cross section of the bottom surface may also be employed.

While the above-described embodiments illustrate the exemplary implementations of the present invention in reference to the annexed figures, these are presented only as illustrations of the invention, and various modifications other than that disclosed above may also be available.

It is apparent that the present invention is not limited to the above embodiment, and may be modified and changed without departing from the scope and spirit of the invention.

What is claimed is:

1. A buried semiconductor laser, comprising:
an n-type indium phosphide (InP) substrate; an active layer disposed on said n-type InP substrate;
block layers bilaterally provided over said active layer and said block layers;
a clad layer provided over said active layer and said block layers; and
a p-type gallium indium arsenide (InGaAs) contact layer provided over said clad layer,
wherein a predetermined portion of said p-type InGaAs contact layer has a compressive strain equal to or less than a critical strain,
wherein said predetermined portion of p-type InGaAs contact layer includes a flat portion remote from a portion thereof immediately above said active layer and an inclined portion immediately above said active layer, said flat portion of the p-type InGaAs contact layer has a compressive strain that is equal to or less than the critical strain, and said inclined portion of the p-type InGaAs contact layer has a tensile strain that is equal to or less than the critical strain.

2. The buried semiconductor laser according to claim 1, wherein said flat portion of the p-type InGaAs contact layer includes a layer thickness of 0.3 μm, and the compressive strain of said flat portion is within a range of from 0.1% to 0.2%.

3. The buried semiconductor laser according to claim 2, wherein said p-type InGaAs contact layer comprises a superlattice structure of a p-type indium arsenide (InAs) layer with a p-type gallium arsenide (GaAs) layer, and
wherein said p-type InAs layer and said p-type GaAs layer have average compressive strains within a range of from 0.1% to 0.2% in said flat portion.

4. A method for manufacturing a buried semiconductor laser, comprising:
forming an active layer on an n-type InP substrate;
forming block layers on both sides of said active layer;
forming a clad layer over said active layer and said block layer; and
forming a p-type InGaAs contact layer over said clad layer,
wherein said forming the p-type InGaAs contact layer includes forming a portion of the p-type InGaAs contact layer having a compressive strain equal to or less than a critical strain.
wherein said forming the portion of the p-type InGaAs contact layer includes forming a flat portion of the p-type InGaAs contact layer remote from a portion thereof immediately above said active layer and an inclined portion immediately above said active layer, said flat portion of the p-type InGaAs contact layer having a compressive strain that is not greater than the critical strain, and said inclined portion of the p-type InGaAs contact layer having a tensile strain that is not greater than the critical strain.

5. The method according to claim 4, wherein said forming the p-type InGaAs contact layer includes forming the p-type InGaAs contact layer, in which said flat portion includes a layer thickness of 0.3 μm, and the compressive strain of said flat portion is within a range of from 0.1% to 0.2%.

6. The method according to claim 5, wherein said forming the p-type InGaAs contact layer includes forming the p-type InGaAs contact layer-comprising of a superlattice structure of a p-type indium arsenide (InAs) layer and a p-type gallium arsenide (GaAs) layer, said p-type InAs layer and said p-type GaAs layer having average compressive strains within a range of from 0.1% to 0.2% in said flat portion.

7. The buried semiconductor laser according to claim 1, wherein the portion of the p-type InGaAs contact layer includes a flat portion having a layer thickness of less than or equal to 0.3 μm, and the compressive strain of said flat portion is within a range of from 0.1% to 0.2%.

8. The buried semiconductor laser according to claim 1, wherein the flat portion of the p-type InGaAs contact layer is remote by at least 50 μm from the active layer.

9. The buried semiconductor laser according to claim 1, wherein a composition of the p-type InGaAs contact layer is within a range from $In_{0.546}Ga_{0.454}As$ to $In_{0.56}Ga_{0.439}As$.

10. A buried semiconductor laser, comprising:
an n-type indium phosphide (InP) substrate;
an active layer disposed on said n-type InP substrate;
block layers bilaterally provided on both sides of said active layer;
a clad layer provided over said active layer and said block layers; and a p-type gallium indium arsenide (InGaAs) contact layer provided over said clad layer,
wherein a predetermined portion of said p-type InGaAs contact layer has a compressive strain equal to or less than a critical strain,
wherein the p-type InGaAs contact layer comprises a superlattice structure including a p-type indium arsenide (InAs) layer and a p-type gallium arsenide (GaAs) layer,
wherein a flat portion of the p-type InAs layer and a flat portion of the p-type GaAs layer have average compressive strains within a range from 0.1% to 0.2%, and
wherein said superlattice structure includes the flat portion and an inclined portion, each of which has a thickness that is not greater than a critical strain.

11. The buried semiconductor laser according to claim 1, wherein the p-type InGaAs contact layer has an average compressive strain within a range from 0.1% to 0.2% in a flat portion.

12. The method according to claim 4, wherein forming the p-type InGaAs comprises growing the p-type InGaAs contact layer to include a flat portion having a compressive strain of 0.1% to 0.2%, the flat portion of the p-type InGaAs contact layer being remote by at least 50 μm from the active layer.

13. The method according to claim 4, wherein forming the p-type InGaAs contact layer comprises:
providing triethylgallium (TEGa) as a source material of Ga, and trimethylindium (TMIn) as a source material of In, and
controlling the flow rates of the source materials of TEGa and TMIn to provide a controlled strain of the InGaAs to have a compressive strain of 0.1 to 0.2%.

14. The method according to claim 13, wherein said controlling the flow rates comprises adjusting the flow rates of triethylgallium and trimethylindium to provide the p-type InGaAs contact layer comprising $In_xGa_yAs_z$, where x is within the range of 0.546 to 0.560, y is within the range of 0.454 to 0.439, and z is equal to 1.

15. A buried semiconductor laser, comprising:
an InP substrate having a first type conductivity;
an active layer disposed on said InP substrate;
block layers bilaterally provided on both sides of said active layer;
a clad layer over said active layer and said block layers; and
a contact layer comprising a second conductivity type indium gallium arsenide (InGaAs) material provided over the clad layer,
wherein said contact layer includes a flat portion remote from a portion thereof immediately above said active layer, and an inclined portion immediately above said active layer, and said contact layer has average compressive strain within a range of from 0.1% to 0.2% in said flat portion,
wherein said contact layer has a tensile strain in said inclined portion, and
wherein said tensile strain is within a range of from 0.1% to 0.2%.

16. The buried semiconductor laser according to claim 15, wherein said contact layer comprises a superlattice structure of an InAs layer with a GaAs layer.

* * * * *